United States Patent
Moote et al.

(10) Patent No.: US 10,677,849 B2
(45) Date of Patent: Jun. 9, 2020

(54) METHODS FOR DETERMINING AND CHARACTERIZING SOFT SHORTS IN ELECTROCHEMICAL CELLS

(71) Applicant: GM GLOBAL TECHNOLOGY OPERATIONS LLC, Detroit, MI (US)

(72) Inventors: John M. Moote, Plymouth, MI (US); Vijay P. Saharan, Grand Blanc, MI (US); Patrick M. Hanley, Bloomfield Hills, MI (US); Edgar P. Calderon, Sterling Heights, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 253 days.

(21) Appl. No.: 15/846,774

(22) Filed: Dec. 19, 2017

(65) Prior Publication Data

US 2019/0187216 A1 Jun. 20, 2019

(51) Int. Cl.
*G01R 31/36* (2020.01)
*H01M 10/42* (2006.01)
(Continued)

(52) U.S. Cl.
CPC ......... *G01R 31/374* (2019.01); *G01N 27/026* (2013.01); *G01R 31/385* (2019.01);
(Continued)

(58) Field of Classification Search
None
See application file for complete search history.

(56) References Cited

U.S. PATENT DOCUMENTS 3,887,396 A * 6/1975 Walsh .......... H01M 2/30
429/128
3,891,457 A * 6/1975 Auborn .......... H01M 6/14
429/104
(Continued)

FOREIGN PATENT DOCUMENTS

JP 07147165 A * 6/1995 .......... G01R 31/025

OTHER PUBLICATIONS

English Translation of JP 07-147165 A publish on Jun. 6, 1995. (Year: 1995).*
(Continued)

*Primary Examiner* — Jermele M Hollington

(57) ABSTRACT

An electrochemical cell comprises an electrolyte capable of facilitating ion transfer between an anode and a cathode. A method for identifying and/or characterizing a soft short in an electrochemical cell comprises cooling the electrochemical cell to an observation temperature at which inter-electrolyte ion migration is substantially inhibited, observing the open circuit voltage (OCV) of the electrochemical cell at the observation temperature for a period of time, and determining the presence of a soft short in the electrochemical cell if the OCV reaches a minimum threshold voltage prior to the expiration of the period of time. The method can optionally further include generating an impedance spectrum for the cell via potentiostatic electrochemical impedance spectroscopy (PETS) at or below the observation temperature, and defining the cell leakage resistance as the maximum impedance limit of the impedance spectrum. The observation temperature can comprise the glass transition temperature of the electrolyte.

19 Claims, 4 Drawing Sheets

(51) Int. Cl.
*G01N 27/02* (2006.01)
*G01N 27/20* (2006.01)
*G01R 31/374* (2019.01)
*G01R 31/385* (2019.01)

(52) U.S. Cl.
CPC ... *H01M 10/4228* (2013.01); *H01M 10/4285* (2013.01); *G01N 27/20* (2013.01)

(56) References Cited

U.S. PATENT DOCUMENTS

| | | | | |
|---|---|---|---|---|
| 2013/0322488 | A1* | 12/2013 | Yazami | G01N 27/27 374/142 |
| 2014/0372055 | A1* | 12/2014 | Wang | G01K 13/00 702/63 |
| 2016/0146895 | A1* | 5/2016 | Yazami | B60L 58/34 324/426 |
| 2017/0072803 | A1* | 3/2017 | Murai | B60L 58/16 |
| 2017/0219660 | A1* | 8/2017 | Christensen | B60L 58/16 |
| 2019/0036350 | A1* | 1/2019 | Gleason | H02J 7/007 |

OTHER PUBLICATIONS

Ganesan Nagasubramanian, Impedance Studies on Cathodes in Li-Ion Cells, Aug. 6, 2002, IEEE Xplore, pp. 968-975 (Year: 2002).*

B.V. Ratnakumar et al., Electrochemical Impedance Spectroscopy and its Applications to Lithium Ion Cells, Aug. 7, 2002, IEEE Xplore, pp. 273-277 (Year: 2002).*

* cited by examiner

METHODS FOR DETERMINING AND CHARACTERIZING SOFT SHORTS IN ELECTROCHEMICAL CELLS

INTRODUCTION

Electrochemical cells are devices configured to generate electric energy via chemical reactions. One example of an electrochemical cell is a lithium ion battery, wherein lithium ions move between a negative electrode (i.e., anode) and a positive electrode (i.e., cathode). Liquid and polymer electrolytes can facilitate the movement of lithium ions between the anode and cathode. Lithium-ion batteries are growing in popularity for defense, automotive, and aerospace applications due to their high energy density and ability to undergo successive charge and discharge cycles.

SUMMARY

Provided is a method for identifying a soft short in an electrochemical cell. The cell includes an electrolyte configured to transfer ions between an anode and a cathode. The method includes cooling the electrochemical cell at least to an observation temperature at which inter-electrolyte ion migration is substantially inhibited, observing the open circuit voltage (OCV) of the electrochemical cell at or below the observation temperature for a period of time, and determining the presence of a soft short in the electrochemical cell if the OCV reaches a minimum threshold voltage prior to the expiration of the period of time. The period of time can be less than about 300 seconds. The threshold voltage can be about 0.2 volts. The threshold voltage can be a fraction of the OCV voltage of the cell measured prior to cooling. The observation temperature can be the glass transition temperature of the electrolyte. The observation temperature can be the freezing point of the electrolyte. The electrochemical cell can be a battery. The electrochemical cell can be a lithium-ion battery. The electrochemical cell can be a supercapacitor. The electrochemical cell can be cooled via liquid nitrogen. The method can be non-destructive. The period of time can commence subsequent to the electrochemical cell achieving the observation temperature.

Also provided is a method for characterizing a soft short in an electrochemical cell. The cell includes an electrolyte configured to transfer ions between an anode and a cathode. The method includes generating an impedance spectrum for the cell via potentiostatic electrochemical impedance spectroscopy (PETS) at or below an observation temperature, and defining the cell leakage resistance as the maximum impedance limit of the impedance spectrum. The observation temperature can be the temperature at which inter-electrolyte ion migration is substantially inhibited. The electrochemical cell can be cooled to the observation temperature via liquid nitrogen. The method can further include determining the suitability of the electrochemical cell by comparing the defined leakage resistance of the cell to a threshold resistance.

Also provided is a method for identifying and characterizing undesired self-discharge in an electrochemical cell. The cell includes an electrolyte configured to transfer ions between an anode and a cathode. The method includes cooling the electrochemical cell at least to an observation temperature at which inter-electrolyte ion migration is substantially inhibited, observing the open circuit voltage (OCV) of the electrochemical cell at or below the observation temperature for a period of time, determining the presence of a soft short in the electrochemical cell if the OCV reaches a minimum threshold voltage prior to the expiration of the period of time, generating an impedance spectrum for the cell via potentiostatic electrochemical impedance spectroscopy (PEIS) at or below the observation temperature, and defining the cell leakage resistance as the maximum impedance limit of the impedance spectrum. The method can be non-destructive. The observation temperature can be the glass transition temperature of the electrolyte. The electrochemical cell can be a lithium-ion battery. Inter-electrolyte ion migration can be ion movement from an electrolyte to an electrode or ion movement from an electrode to an electrolyte.

Other objects, advantages and novel features of the exemplary embodiments will become more apparent from the following detailed description of exemplary embodiments and the accompanying drawings.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Electrochemical cells can exhibit varying levels of self-discharge or "cell droop" caused by soft shorts which can exist as a result of manufacturing defects or cell aging, for example. Measuring the self-discharge of an electrochemical cell can be time consuming. Further, other cell conditions, such as cell voltage relaxation, can be confused with self-discharge. Provided herein are non-destructive methods which can quickly detect the presence of soft shorts, and the further characterize the magnitudes of the same. Although the methods will be described in relation to lithium battery cells for the sake of illustration only, the methods are suitable for use with all electrochemical cells.

Figure 1:
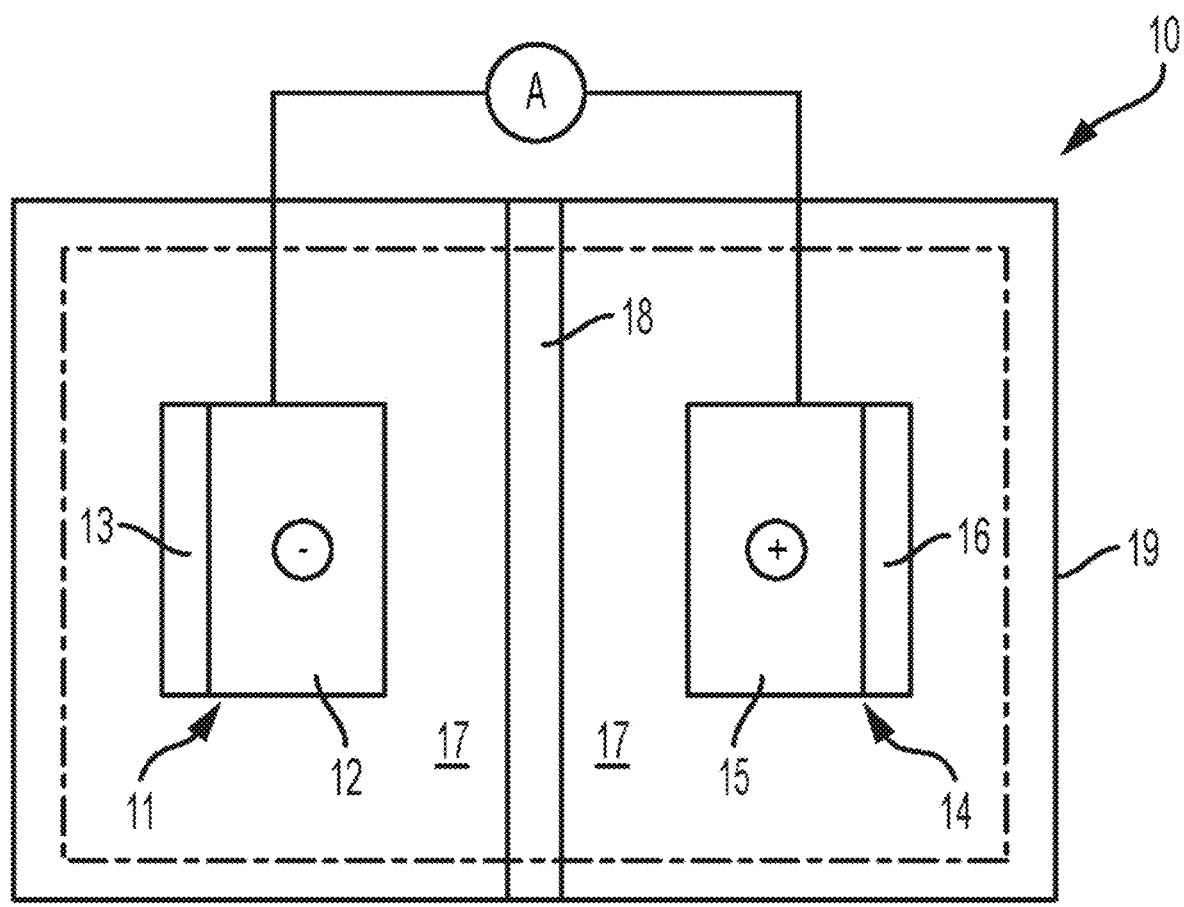
FIG. 1 illustrates a lithium battery cell, according to one or more embodiments.

FIG. 1 illustrates a lithium battery cell 10 comprising a negative electrode (i.e., the anode) 11, a positive electrode (i.e., the cathode) 14, an electrolyte 17 operatively disposed between the Anode 11 and the cathode 14, and a separator 18. Anode 11, cathode 14, and electrolyte 17 can be encapsulated in container 19, which can be a hard (e.g., metallic) case or soft (e.g., polymer) pouch, for example. The Anode 11 and cathode 14 are situated on opposite sides of separator 18 which can comprise a microporous polymer or other suitable material capable of conducting lithium ions and optionally electrolyte (i.e., liquid electrolyte). For example, the electrolyte can comprise a polymer or a liquid electrolytic solution. Liquid electrolytes 17 can include $LiPF_6$, $LiBF_4$, and $LiClO_4$, among others, dissolved in a non-aqueous solvent. Polymer electrolytes 17 can include one or more polymers, such as polyethyleneoxide (PEO) or polyacrylonitrile, among others, and one or more lithium salts, such as $LiPF_6$, $LiBF_4$, $LiClO_4$, LiSICON, or LiPON, among others. Anode 11 generally includes a current collector 12 and a lithium intercalation host material 13 applied thereto. Cathode 14 generally includes a current collector 15 and a lithium-based active material 16 applied thereto. In one example, anode 11 comprises lithium. In one embodiment, anode 11 comprises lithium and cathode 14 comprises sulfur. Active material 16 can store lithium ions at a higher electric potential than intercalation host material 13, for example. The current collectors 12 and 15 associated with the two electrodes are connected by an interruptible external circuit that allows an electric current to pass between the electrodes to electrically balance the related migration of lithium ions. Although FIG. 1 illustrates host material 13 and active material 16 schematically for the sake of clarity, host material 13 and active material 16 can comprise an exclusive interface between the anode 11 and cathode 14, respectively, and electrolyte 17.

Host material 13 can include any lithium host material that can sufficiently undergo lithium ion intercalation, deintercalation, and alloying, while functioning as the negative terminal of the lithium ion battery 10. Host material 13 can also include a polymer binder material to structurally hold the lithium host material together. For example, in one embodiment, host material 13 can include graphite intermingled in one or more of polyvinyldiene fluoride (PVdF), an ethylene propylene diene monomer (EPDM) rubber, carboxymethoxyl cellulose (CMC), and styrene, 1,3-butadiene polymer (SBR). Graphite and carbon materials are widely utilized to form the negative electrode because it exhibits favorable lithium ion intercalation and deintercalation characteristics, is relatively non-reactive, and can store lithium ions in quantities that produce a relatively high energy density. Other materials can also be used to form the host material 13, for example, including one or more of lithium titanate, silicon, silicon oxide, tin, lithium metal, and tin oxide. Anode current collector 12 can include copper, aluminum, stainless steel, or any other appropriate electrically conductive material known to skilled artisans. Anode current collector 12 can be treated (e.g., coated) with highly electrically conductive materials, including one or more of conductive carbon black, graphite, carbon nanotubes, carbon nanofiber, graphene, and vapor growth carbon fiber (VGCF), among others.

Active material 16 can include any lithium-based active material that can sufficiently undergo lithium intercalation and deintercalation while functioning as the positive terminal of battery cell 10. Active material 16 can also include a polymer binder material to structurally hold the lithium-based active material together. One common class of known materials that can be used to form active material 16 is layered lithium transitional metal oxides. For example, in various embodiments, active material 16 can comprise one or more of spinel lithium manganese oxide ($LiMn_2O_4$), lithium cobalt oxide ($LiCoO_2$), a nickel-manganese-cobalt oxide [$Li(Ni_xMn_yCo_z)O_2$], or a lithium iron polyanion oxide such as lithium iron phosphate ($LiFePO_4$) or lithium iron fluorophosphate ($Li_2FePO_4F$) intermingled in at least one of polyvinyldiene fluoride (PVdF), an ethylene propylene diene monomer (EPDM) rubber, carboxymethoxyl cellulose (CMC), and styrene, 1,3-butadiene polymer (SBR). Other lithium-based active materials can also be utilized besides those just mentioned. Those alternative materials include, but are not limited to, lithium nickel oxide ($LiNiO_2$), lithium aluminum manganese oxide ($Li_xAl_yMn_{1-y}O_2$), and lithium vanadium oxide ($LiV_2O_5$), to name but a few. Cathode current collector 15 can include aluminum or any other appropriate electrically conductive material known to skilled artisans, and can be formed in a foil or grid shape. Cathode current collector 15 can be treated (e.g., coated) with highly electrically conductive materials, including one or more of conductive carbon black, graphite, carbon nanotubes, carbon nanofiber, graphene, and vapor growth carbon fiber (VGCF), among others.

Any appropriate electrolyte solution that can conduct lithium ions between Anode 11 and cathode 14 can be used in battery cell 10. In one embodiment, the electrolyte solution can be a non-aqueous liquid electrolyte solution that includes a lithium salt dissolved in an organic solvent or a mixture of organic solvents. Skilled artisans are aware of the many non-aqueous liquid electrolyte solutions that can be employed in battery cell 10 as well as how to manufacture or commercially acquire them. A non-limiting list of lithium salts that can be dissolved in an organic solvent to form the non-aqueous liquid electrolyte solution include $LiClO_4$, $LiAlCl_4$, LiI, LiBr, LiSCN, $LiBF_4$, $LiB(C_6H_5)_4$ $LiAsF_6$, $LiCF_3SO_3$, $LiN(CF_3SO_2)_2$, $LiPF_6$, and mixtures thereof. These and other similar lithium salts can be dissolved in a variety of organic solvents such as, but not limited to, cyclic carbonates (ethylene carbonate, propylene carbonate, butylene carbonate), acyclic carbonates (dimethyl carbonate, diethyl carbonate, ethylmethylcarbonate), aliphatic carboxylic esters (methyl formate, methyl acetate, methyl propionate), γ-lactones (γ-butyrolactone, γ-valerolactone), chain structure ethers (1,2-dimethoxyethane, 1-2-diethoxyethane, ethoxymethoxyethane), cyclic ethers (tetrahydrofuran, 2-methyltetrahydrofuran), and mixtures thereof.

The microporous polymer separator 18 can comprise, in one embodiment, a polyolefin. The polyolefin can be a homopolymer (derived from a single monomer constituent) or a heteropolymer (derived from more than one monomer constituent), either linear or branched. If a heteropolymer derived from two monomer constituents is employed, the polyolefin can assume any copolymer chain arrangement including those of a block copolymer or a random copolymer. The same holds true if the polyolefin is a heteropolymer derived from more than two monomer constituents. In one embodiment, the polyolefin can be polyethylene (PE), polypropylene (PP), or a blend of PE and PP. Separator 18 can optionally be ceramic-coated with materials including one or more of ceramic type aluminum oxide (e.g., $Al_2O_3$), and lithiated zeolite-type oxides, among others. Lithiated zeolite-type oxides can enhance the safety and cycle life performance of lithium ion batteries, such as battery cell 10.

The microporous polymer separator 18 may be a single layer or a multi-layer laminate fabricated from either a dry or wet process. For example, in one embodiment, a single layer of the polyolefin may constitute the entirety of the microporous polymer separator 18. As another example, however, multiple discrete layers of similar or dissimilar polyolefins may be assembled into the microporous polymer separator 18. The microporous polymer separator 18 may also comprise other polymers in addition to the polyolefin such as, but not limited to, polyethylene terephthalate (PET), polyvinylidene fluoride (PVdF), and or a polyamide (Nylon). The polyolefin layer, and any other optional polymer layers, may further be included in the microporous polymer separator 18 as a fibrous layer to help provide the microporous polymer separator 18 with appropriate structural and porosity characteristics. Skilled artisans will undoubtedly know and understand the many available polymers and commercial products from which the microporous polymer separator 18 may be fabricated, as well as the many manufacturing methods that may be employed to produce the microporous polymer separator 18.

Battery cell 10 generally operates by reversibly passing lithium ions between Anode 11 and cathode 14. The transport of lithium ions between anode 22 and cathode 14 is facilitated by electrolyte 17. Lithium ions move from cathode 14 to Anode 11 while charging, and move from Anode 11 to cathode 14 while discharging. At the beginning of a discharge, Anode 11 contains a high concentration of intercalated lithium ions while cathode 14 is relatively depleted, and establishing a closed external circuit between Anode 11 and cathode 14 under such circumstances causes intercalated lithium ions to be extracted from Anode 11. The extracted lithium atoms are split into lithium ions and electrons as they leave an intercalation host at an electrode-electrolyte interface. The lithium ions are carried through the micropores of separator 18 from Anode 11 to cathode 14 by the ionically conductive electrolyte 17 while, at the same time, the electrons are transmitted through the external circuit from Anode 11 to cathode 14 to balance the overall electrochemical cell. This flow of electrons through the external circuit can be harnessed and fed to a load device until the level of intercalated lithium in the negative electrode falls below a workable level or the need for power ceases. The arrows indicate that current is flowing out of Anode 11 and that current is flowing into cathode 14, and thus battery cell 10 is shown in a charging state.

Battery cell 10 may be recharged after a partial or full discharge of its available capacity. To charge or re-power the lithium ion battery cell, an external power source (not shown) is connected to the positive and the negative electrodes to drive the reverse of battery discharge electrochemical reactions. That is, during charging, the external power source extracts the lithium ions present in cathode 14 to produce lithium ions and electrons. The lithium ions are carried back through the separator by the electrolyte solution, and the electrons are driven back through the external circuit, both towards Anode 11. The lithium ions and electrons are ultimately reunited at the negative electrode, thus replenishing it with intercalated lithium for future battery cell discharge.

Lithium ion battery cell 10, or a battery module or pack comprising a plurality of battery cells 10 connected in series and/or in parallel, can be utilized to reversibly supply power and energy to an associated load device. Lithium ion batteries may also be used in various consumer electronic devices (e.g., laptop computers, cameras, and cellular/smart phones), military electronics (e.g., radios, mine detectors, and thermal weapons), aircrafts, and satellites, among others. Lithium ion batteries, modules, and packs may be incorporated in a vehicle such as a hybrid electric vehicle (HEV), a battery electric vehicle (BEV), a plug-in HEV, or an extended-range electric vehicle (EREV) to generate enough power and energy to operate one or more systems of the vehicle. For instance, the battery cells, modules, and packs may be used in combination with a gasoline or diesel internal combustion engine to propel the vehicle (such as in hybrid electric vehicles), or may be used alone to propel the vehicle (such as in battery powered vehicles).

Figure 2:
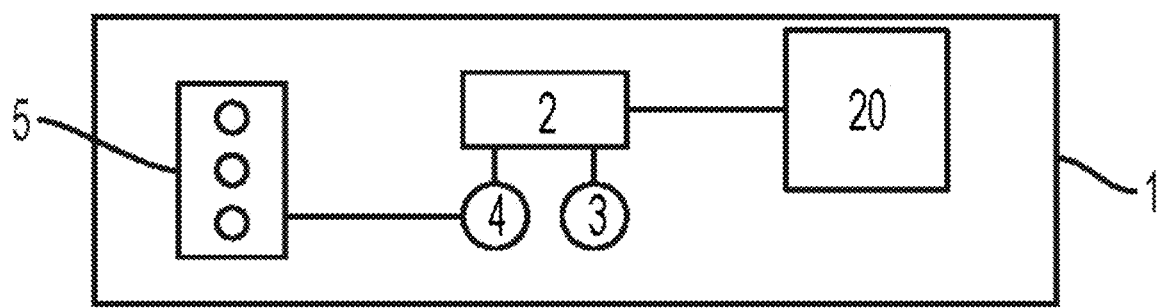
FIG. 2 illustrates a schematic diagram of a hybrid-electric vehicle, according to one or more embodiments.

FIG. 2 illustrates a schematic diagram of a hybrid-electric vehicle 1 including a battery pack 20 and related components. A battery pack such as the battery pack 20 can include a plurality of battery cells 10. A plurality of battery cells 10 can be connected in parallel to form a group, and a plurality of groups can be connected in series, for example. One of skill in the art will understand that any number of battery cell connection configurations are practicable utilizing the battery cell architectures herein disclosed, and will further recognize that vehicular applications are not limited to the vehicle architecture as described. Battery pack 20 can provide energy to a traction inverter 2 which converts the direct current (DC) battery voltage to a three-phase alternating current (AC) signal which is used by a drive motor 3 to propel the vehicle 1. An engine 5 can be used to drive a generator 4, which in turn can provide energy to recharge the battery pack 20 via the inverter 2. External (e.g., grid) power can also be used to recharge the battery pack 20 via additional circuitry (not shown). Engine 5 can comprise a gasoline or diesel engine, for example.

Electrochemical cells are generally utilized as voltage sources, wherein the cell potential (in volts) is measured voltage difference between the two electrodes (e.g., between an anode 11 and a cathode 14) of the cell. By virtue of their materials of construction, electrochemical cells also exhibit internal resistances. Accordingly, the cell can be modeled as a voltage source (e.g., two electrodes in series exhibiting an electric potential) in series with a resistor. Over time, an electrochemical cell may experience gradual self-discharge as a result of various cell characteristics, such as soft shorts and undesired internal cell reactions cause, for example, by impurities in the electrode materials. A soft short is an undesired current path that allows the two electrodes to achieve the same voltage, or otherwise allow the electric potential to approach zero. The resistance of the soft short can be referred to as the "leakage resistance". Because a soft short is in parallel with the internal resistance of the cell and in series with the voltage source, the leakage resistance cannot be directly measured. In order to determine the presence of a soft short, the open circuit voltage (OCV) of the cell may be observed for a period of time (e.g., at ambient conditions), wherein achieving an OCV of 0 volts can indicate the presence of a soft short. The OCV is the measured electrical potential difference between two terminals of an electrochemical cell, while no external load or electrical power supply is connected. However, it may take days or weeks (e.g., longer than 14 days) to determine the presence of a soft short, particularly if the leakage resistance is relatively high.

Figure 3:
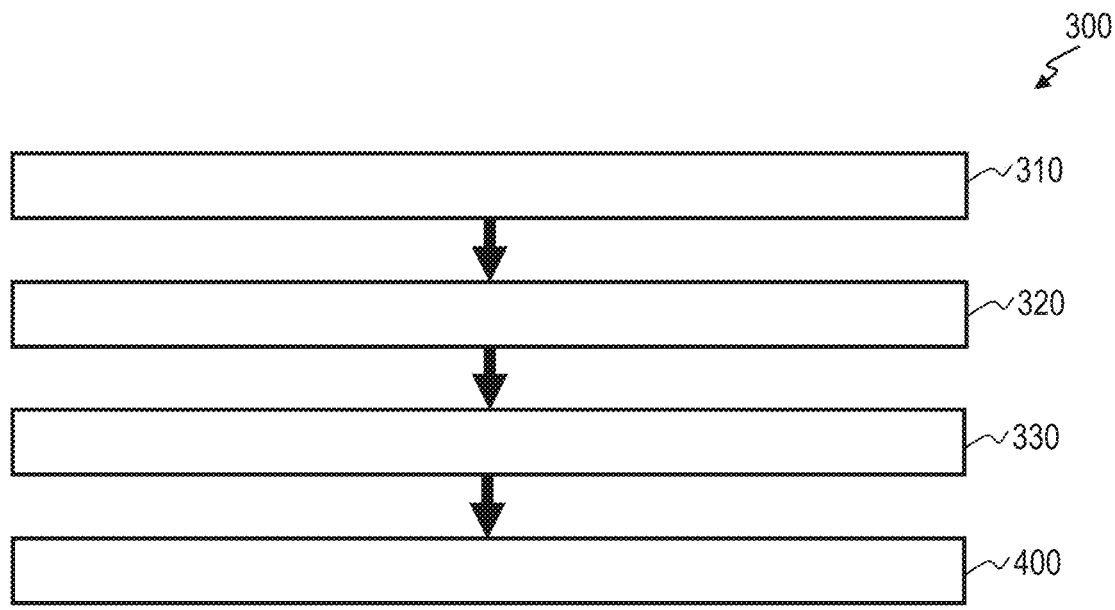
FIG. 3 illustrates a block diagram of a method for identifying a soft short in an electrochemical cell, according to one or more embodiments.

FIG. 3 illustrates a block diagram of a method 300 for identifying undesired self-discharge in an electrochemical cell which may be implemented in a matter of seconds or minutes (e.g., less than 300 seconds). Undesired self-discharge can be caused by one or more soft shorts, for example. The method comprises cooling 310 the electrochemical cell, observing 320 the OCV of the electrochemical cell, and determining 330 the presence of a soft short in the electrochemical cell if the open cell voltage substantially approaches a minimum threshold voltage prior to the expiration of the period of time. Substantially approaching can comprise reaching the minimum threshold. The electrochemical cell can be any cell as defined above. Specific examples of electrochemical cells include batteries (e.g., lithium ion batteries) and supercapacitors, among others. Observing 320 the OCV of the electrochemical cell can comprise measuring the potential between two electrodes, in one embodiment.

Cooling 310 comprises cooling the electrochemical cell at least to an observation temperature at which inter-electrolyte ion migration is substantially inhibited. Inter-electrolyte ion migration comprises the movement of ions into or out of the electrolyte. For example, inter-electrolyte ion migration can comprise ion movement from an electrolyte to an electrode (e.g., ion intercalation), or ion movement from an electrode to an electrolyte (e.g., ion deintercalation). While at the observation temperature, the temperature-dependent transport of ions (e.g., lithium ions for a lithium ion battery) is substantially inhibited, and the electrochemical cell is effectively transformed into a capacitor. As a capacitor, open circuit potential is no longer supported by cell chemistry (i.e., ion transport), and any self-discharge of the battery is facilitated via undesired battery characteristics (e.g., a soft short).

The observation temperature can comprise the freezing point of the electrolyte. For example, the observation temperature can be the freezing point of a liquid electrolyte for a battery. The observation temperature can comprise the glass transition temperature of the electrolyte. For example, the observation temperature can be the glass transition temperature of a liquid electrolyte for a battery, or all other non-liquid electrolytes for a battery which may not exhibit a freezing temperature. The observation temperature can be less than about −90° C. for some electrochemical cells, for example. In some embodiments, the electrochemical cell is cooled via liquid nitrogen. For example, the electrochemical cell can be dipped or otherwise immersed in liquid nitrogen. When liquid nitrogen is utilized for cooling, the observation temperature about −195° C. or less, in such embodiments.

The threshold voltage can comprise substantially 0 volts. Substantially 0 volts can comprise less than about 0.5 volts, less than about 0.2 volts, less than about 0.1 volts, or less than about 0.05 volts, for example. In other embodiments, the threshold voltage can comprise a fraction of the OCV voltage of the cell measured prior to cooling 310. For example, the threshold voltage can comprise half of the OCV voltage of the cell measured prior to cooling 310. Observing 320 the OCV of the electrochemical cell can occur for a period of time. The period of time can be tailored to the physical characteristics of the electrochemical cell, and the severity of the soft short which is being determined. For example, a first cell may have a soft short with a leakage resistance of about 1 M-ohm that self-discharges the first cell to about 0 volts after about 2 to 3 minutes, whereas a second cell may have a relatively more severe soft short with a leakage resistance of about 30 k-ohm that self-discharges the second cell in about 20 seconds. Accordingly, the period of time can be calibrated to ensure that soft shorts of sufficient magnitude are identified. In one embodiment, where the method 300 is utilized to determine the presence of a soft short in a battery cell used to power an electric vehicle or a hybrid electric vehicle, the observation time can comprise up to about 200 seconds, up to about 250 seconds, or up to about 300 seconds. The period of time can commence subsequent to the cell achieving the observation temperature. It should be noted that in some instances, the leakage resistance of a soft short is sufficiently small such that a cell may partially or fully self-discharge to substantially 0 volts before the cell reaches its observation temperature. Accordingly, it is possible for a cell to self-discharge to substantially 0 volts before the period of time commences.

Figure 5:
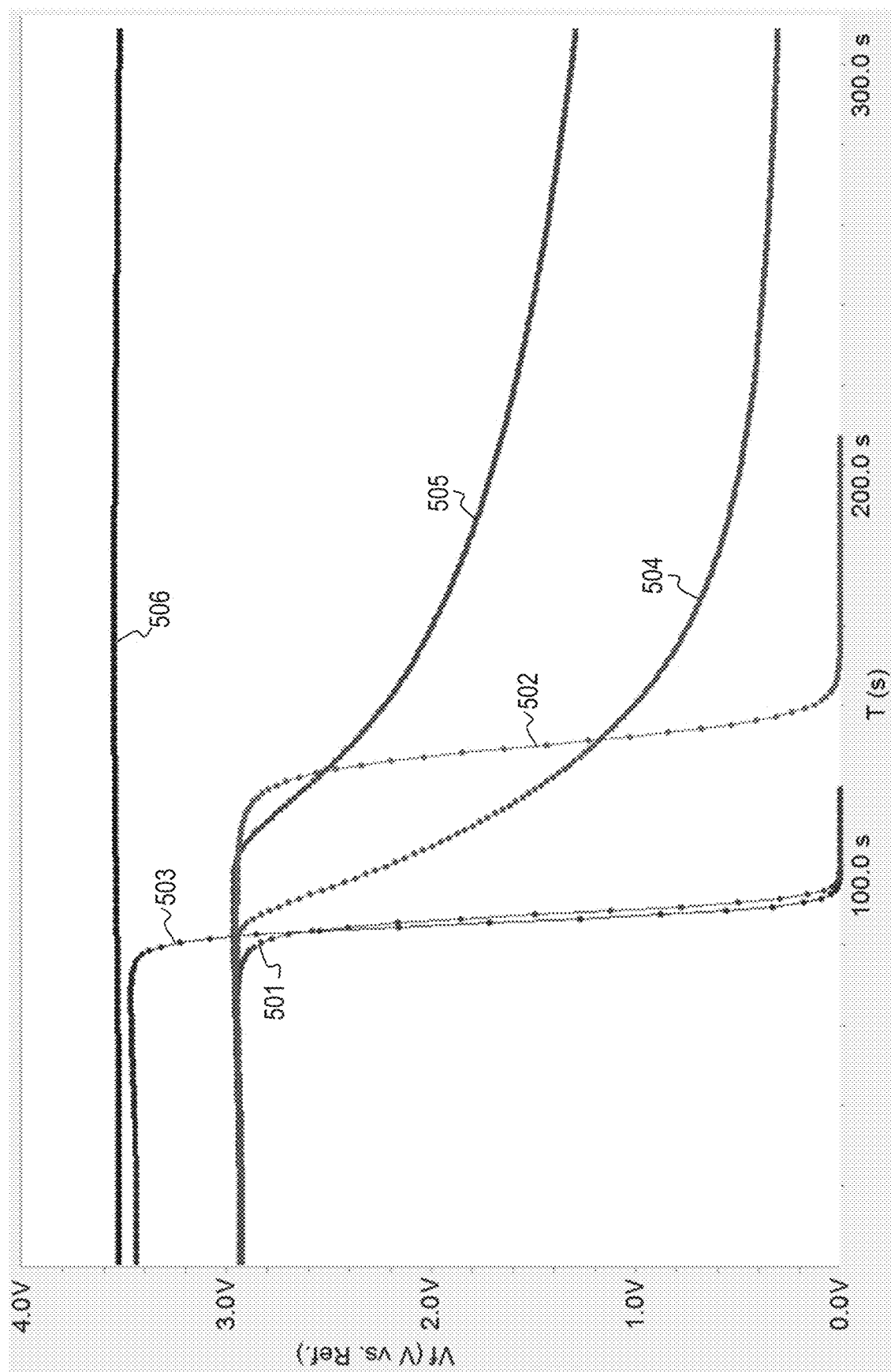
FIG. 5 illustrates an open circuit voltage vs. temperature plot for several electrochemical cells, according to one or more embodiments.

FIG. 5 illustrates an OCV vs. temperature plot for several electrochemical cells (501-506) cooled 310 and observed 320 per method 300. Cells 501-506 generally achieve their respective observation temperatures at approximately 70 seconds, whereafter self-discharge occurs. Cells 503 and 501 self-discharge immediately (i.e., within about 10 seconds of the cell achieving the observation temperature), whereas cells 502, 504, 505, and 506 self-discharge at progressively lower rates, indicating progressively higher leakage resistances for each cell's respective soft short. Cell 506 self-discharges at such a low rate so as to suggest the absence of a soft short. In some embodiments, the severity of a soft short can be calibrated to correspond to a time limit in which a cell will self-discharge to an OCV of substantially 0 volts. For example, a "worst performing acceptable" battery for an electric vehicle or hybrid electric vehicle can be identified as one which does not self-discharge to an OCV of substantially 0 volts within 200 seconds of the cell achieving the observation temperature. In such an embodiment, cells 504, 505, and 506 would accordingly be identified as suitably performing batteries. The speed with which such cells are examined is contrasted to ambient observation methods which can require durations measured in weeks.

Figure 4:
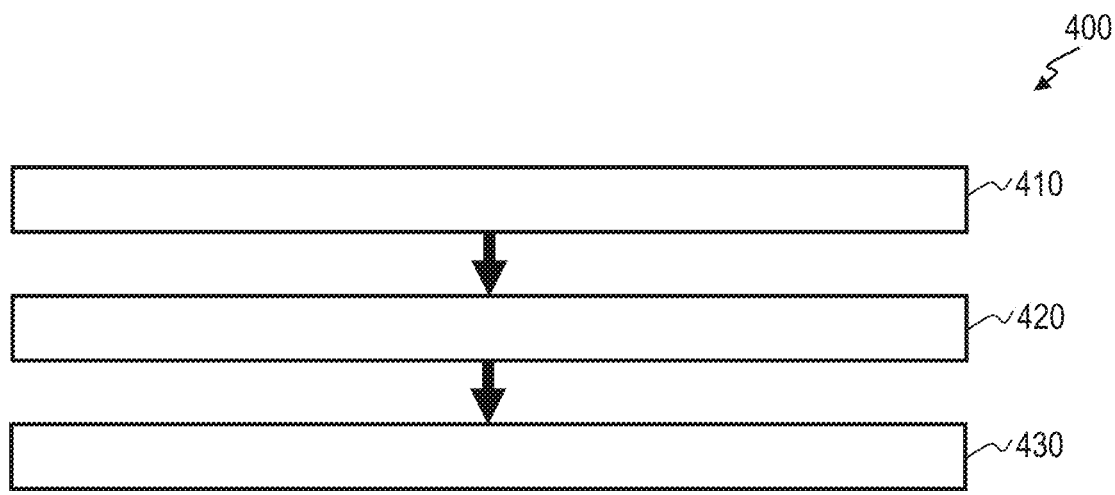
FIG. 4 illustrates a block diagram of a method for quantifying the leakage resistance of an electrochemical cell, according to one or more embodiments.

Method 300 can further comprise implementing method 400 to quantify the leakage resistance of the electrochemical cell. In some embodiments, method 400 can be implemented to quantify the minimum leakage resistance of the electrochemical cell. FIG. 4 illustrates a block diagram of method 400, which can alternatively be implemented discretely from method 300, and comprises generating 410 an impedance spectrum for the cell via potentiostatic electrochemical impedance spectroscopy (PEIS) at or below the observation temperature, and defining 420 the cell leakage resistance as the maximum impedance limit of the impedance spectrum. Specifically, in some embodiments, the cell leakage resistance can be defined 420 as the maximum impedance limit of the impedance spectrum at the low frequency range of the spectrum. In some embodiments, the defined 420 cell leakage resistance is the minimum cell leakage resistance. In general, a maximum impedance limit occurs as frequency decreases. An impedance spectrum comprises one or a plurality of impedance measurements. In embodiments wherein an impedance spectrum comprises a plurality of impedance measurements, the impedance measurements can be taken at different frequencies.

PEIS is a known method, which applies an oscillating potential at varying frequencies to an electrochemical cell while simultaneously measuring the AC current response through the cell at each frequency. According to Ohm's law, impedance is a transfer function defined by the ratio of an input oscillating potential and an observed AC current. Therefore the range of perturbation potentials and the corresponding measured AC currents can be converted to impedance spectra via Ohm's law. However, because the cell is at the observation temperature during implementation of PEIS, the determined cell impedance comprises the leakage resistance.

Figure 6:
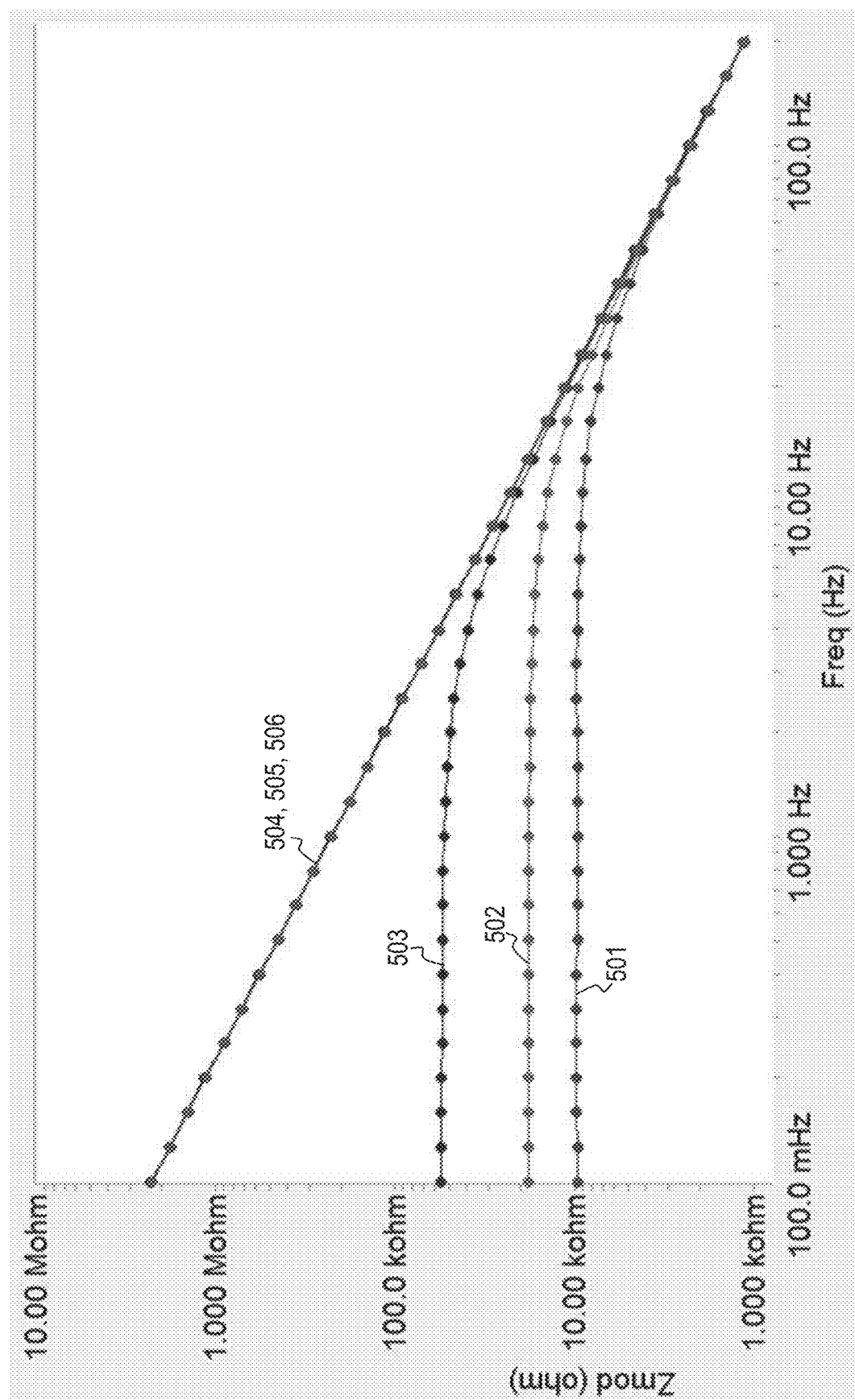
FIG. 6 illustrates the impedance spectra generated via PEIS for several electrochemical cells, according to one or more embodiments.

FIG. 6 illustrates the impedance spectra generated via PEIS of the same electrochemical cells (501-506) which were the subject of FIG. 5. It is observed that a maximum impedance limit is achieved by some cells (i.e., 501, 502, and 503) as the frequency decreases. For example, the impedance spectrum of cell 501 exhibits a maximum impedance limit of about 10 k-Ohms. Cells 503, 502, and 501 exhibit soft shorts of progressively higher severity, as indicated by the progressively decreasing leakage resistances. Within the scope of the spectra presented, cells 504, 505, and 506 do not exhibit soft shorts (i.e., there is no defined leakage resistance via the presence of a maximum impedance limit); although, in light of FIG. 5, it is conceivable that a soft short for cells 504 and 505 (and possibly 506) would exhibit a soft sort if the spectra were extended to sufficiently low frequencies.

For the purposes of identifying acceptable electrochemical cells (e.g., suitable battery cells for an electric vehicle or hybrid electric vehicle), the scope of the impedance spectrum can be tailored to ensure that soft shorts of sufficient magnitudes are identified. For example, a "worst performing acceptable" battery for an electric vehicle or hybrid electric vehicle can be identified as one which does not exhibit a maximum impedance limit within an impedance spectrum with a lower bound of 1 Hz. In other embodiments, the determined leakage resistance can be utilized to service, or otherwise replace an electrochemical cell for a particular application. For example, method 400 can further comprise determining 430 the suitability of an electrochemical cell by comparing the defined 420 leakage resistance of the cell to a threshold resistance. Specifically, a cell can be determined to be suitable if the defined leakage resistance is above the threshold resistance, whereas a cell can be determined to be unsuitable if the defined leakage resistance is below the threshold resistance. The threshold resistance can be calibrated based on the physical characteristics of the cell, and/or the intended application of the cell (e.g., a lithium ion battery for an electric vehicle or hybrid electric vehicle).

Methods 300 and 400 comprise non-destructive methods. Specifically, method 300 (i.e., freezing and successive rewarming of the electrochemical cell) is non-destructive in that it causes no substantial impact on cell performance. Cell performance can be defined by characteristics such as charge resistance, discharge resistance, and cell capacity.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A method for identifying a soft short in an electrochemical cell comprising an electrolyte configured to transfer ions between an anode and a cathode, the method comprising:
    cooling the electrochemical cell at least to an observation temperature at which inter-electrolyte ion migration is substantially inhibited;
    observing an open circuit voltage (OCV) of the electrochemical cell at or below the observation temperature for a period of time; and
    determining the presence of a soft short in the electrochemical cell if the OCV reaches a minimum threshold voltage prior to the expiration of the period of time, wherein the threshold voltage comprises about 0.2 volts.

2. The method of claim 1, wherein the period of time is less than about 300 seconds.

3. The method of claim 1, wherein the threshold voltage comprises a fraction of the OCV voltage of the electrochemical cell measured prior to cooling.

4. The method of claim 1, wherein the observation temperature comprises the glass transition temperature of the electrolyte.

5. The method of claim 1, wherein the observation temperature comprises the freezing point of the electrolyte.

6. The method of claim 1, wherein the electrochemical cell comprises a battery.

7. The method of claim 1, wherein the electrochemical cell comprises a lithium-ion battery.

8. The method of claim 1, wherein the electrochemical cell comprises a supercapacitor.

9. The method of claim 1, wherein the electrochemical cell is cooled via liquid nitrogen.

10. The method of claim 1, wherein the method is non-destructive.

11. The method of claim 1, wherein the period of time commences subsequent to the electrochemical cell achieving the observation temperature.

12. A method for characterizing a soft short in an electrochemical cell comprising an electrolyte configured to transfer ions between an anode and a cathode, the method comprising:
    generating an impedance spectrum for the electrochemical cell via potentiostatic electrochemical impedance spectroscopy (PETS) at or below an observation temperature; and
    defining a cell leakage resistance as the maximum impedance limit of the impedance spectrum,
wherein the observation temperature comprises the temperature at which inter-electrolyte ion migration is substantially inhibited.

13. The method of claim 12, wherein the electrochemical cell is cooled to the observation temperature via liquid nitrogen.

14. The method of claim 12, further comprising determining the suitability of the electrochemical cell by comparing the defined leakage resistance of the electrochemical cell to a threshold resistance.

15. A method for identifying and characterizing undesired self-discharge in an electrochemical cell comprising an electrolyte configured to transfer ions between an anode and a cathode, the method comprising:
    cooling the electrochemical cell at least to an observation temperature at which inter-electrolyte ion migration is substantially inhibited;

observing an open circuit voltage (OCV) of the electrochemical cell at or below the observation temperature for a period of time;

determining the presence of a soft short in the electrochemical cell if the OCV reaches a minimum threshold voltage prior to the expiration of the period of time;

generating an impedance spectrum for the electrochemical cell via potentiostatic electrochemical impedance spectroscopy (PETS) at or below the observation temperature; and defining a cell leakage resistance as the maximum impedance limit of the impedance spectrum.

16. The method of claim 15, wherein the method is non-destructive.

17. The method of claim 15, wherein the observation temperature comprises the glass transition temperature of the electrolyte.

18. The method of claim 15, wherein the electrochemical cell comprises a lithium-ion battery.

19. The method of claim 15, wherein inter-electrolyte ion migration comprises ion movement from an electrolyte to an electrode or ion movement from an electrode to an electrolyte.

* * * * *